United States Patent [19]

Vanzetti et al.

[11] Patent Number: 4,696,101

[45] Date of Patent: Sep. 29, 1987

[54] METHOD AND APPARATUS FOR PLACING AND ELECTRICALLY CONNECTING COMPONENTS ON A PRINTED CIRCUIT BOARD

[75] Inventors: Riccardo Vanzetti, Brockton; Ashod S. Dostoomian, Stoughton, both of Mass.

[73] Assignee: Vanzetti Systems, Inc., Stoughton, Mass.

[21] Appl. No.: 908,920

[22] Filed: Sep. 19, 1986

Related U.S. Application Data

[63] Continuation of Ser. No. 742,178, Jun. 7, 1985, abandoned.

[51] Int. Cl.[4] .............................................. B23P 19/00
[52] U.S. Cl. ........................................... 29/740; 228/9
[58] Field of Search ..................... 228/44.7, 103, 9; 29/840, 843, 407, 829, 739, 740, 741, 593

[56] References Cited

U.S. PATENT DOCUMENTS

| | | | |
|---|---|---|---|
| 3,020,745 | 2/1962 | Sielicki | 29/407 |
| 3,302,277 | 2/1967 | Pruden et al. | 29/407 X |
| 3,439,855 | 4/1969 | Arndt et al. | 228/44.7 |
| 3,610,508 | 10/1971 | Laubmeyer | 228/102 X |
| 3,628,717 | 12/1971 | Lynch et al. | 228/44.7 X |
| 3,827,619 | 8/1974 | Cusick et al. | 29/407 X |
| 4,084,315 | 4/1978 | Michaels | 29/740 |
| 4,180,199 | 12/1979 | O'Rourke et al. | 228/9 X |
| 4,224,744 | 9/1980 | Siegel et al. | 228/103 X |
| 4,316,072 | 2/1982 | Arnoldt | 228/44.7 X |
| 4,327,265 | 4/1982 | Edinger et al. | 228/103 X |
| 4,481,418 | 11/1984 | Vanzetti et al. | 250/338 |
| 4,501,064 | 2/1985 | Dinozzi et al. | 29/740 X |

FOREIGN PATENT DOCUMENTS 867544 9/1981 U.S.S.R. ............................ 228/44.7

*Primary Examiner*—Howard N. Goldberg
*Assistant Examiner*—Joseph M. Gorski
*Attorney, Agent, or Firm*—Sughrue, Mion, Zinn, Macpeak, and Seas

[57] ABSTRACT

A system for placing, soldering and inspecting component parts, such as soldered joints and electronic components, on a printed circuit board utilizes a transfer device for selecting and transferring specific electronic component parts to predetermined positions on a printed circuit board and holding each component part in the desired position by use of the transfer device during a reflow soldering operation to mechanically and electrically connect the component part to the printed circuit board. The reflow soldering utilizes a laser beam for injecting thermal energy into each soldered joint to melt the soldered material. An infrared detector senses thermal radiation and/or reflected radiation from the heated solder material to discontinue the application of the laser beam to the solder material upon liquifaction of the solder material. The infrared detector also continues to sense the thermal radiation from the heated solder material during cool down to provide a signal which will be compared with a standard signal to determine the quality of the solder joint.

5 Claims, 7 Drawing Figures

METHOD AND APPARATUS FOR PLACING AND ELECTRICALLY CONNECTING COMPONENTS ON A PRINTED CIRCUIT BOARD

This is a continuation of application Ser. No. 742,178, filed Jun. 7, 1985, now abandoned.

BACKGROUND OF THE INVENTION

The present invention is directed to a method and apparatus for placing and electrically connected components on a printed circuit board and more specifically to an automatic system for feeding and locating individual components relative to a printed circuit board wherein the components and circuit board have contact means which are pre-tinned or otherwise supplied in advance with solder material and which are to be connected by a reflow soldering technique utilizing a laser beam or other heating material under the control of an infrared detector which also serves to inspect the individually formed solder joints.

At the present time the manufacture of electronic printed circuit boards requires a large number of individual steps each of which is carried out by separate pieces of equipment which requires not only a very large capital investment but which also is relatively slow due to the need for transferring the circuit board from one machine to another for each operation to be performed in sequence.

The use of pick and place machines in the production of printed circuit board assemblies is old and well known in the art. Such machines are usually controlled by a group of integrated microcomputers and provide for the automatic feeding of electronic components to a printed circuit board. One or more pick and place heads are provided which are automatically selected depending upon the type of component to be placed. Each pick and place head is usually provided with vacuum and/or a tweezer jaw assembly for picking up the specific electronic component and transferring it to the desired predetermined position on a printed circuit board. The pick and place head and/or the printed circuit board are suitably indexed in an X-Y pattern to sequentially locate all of the components in the proper position on a single circuit board. Such machines are provided with an independent adhesive applicator head which dispenses a predetermined amount of epoxy adhesive or solder paste at predetermined locations on the circuit board. Thus upon placement of the individual electronic components on the circuit board they will be held in the desired position by the epoxy adhesive or the solder paste. The completed printed circuit board assembly will then be transferred to a separate machine for soldering the components to the printed circuit board to provide the desired electrical connections therebetween. Examples of such well known pick and place devices are the MPS-500 and MPS-100 pick and place systems produced by the Dyna/Pert Division of the Emhart Machinery Group in Beverly, Mass. Such pick and place systems are designed to handle small chip resistors, capacitors and diodes; small outline transistors; small outline integrated circuits and leaded or leadless chip carriers, both ceramic and plastic.

With the various components temporarily held in place on a printed circuit board by means of an adhesive the printed circuit board is then transferred to the soldering station to permanently secure the components to the printed circuit board by means of electrically conductive solder joints. The process of applying solder to form a permanent mechanical and electrical bond between two conductors on a printed circuit board is carried out in various ways which will be familiar to practitioners of the soldering art and need not be discussed at length herein. For small scale production, solder joints are individually hand soldered and for large scale production an entire circuit board requiring hundreds or thousands of solder joints can be soldered in one step by wave soldering or by reflow soldering.

According to the wave soldering method, after certain preparatory steps, the board is passed over the surface of a molten solder wave where the solder is caused to adhere to local areas at the intended joints. Such a system however is difficult to use for a printed circuit board having surface mounted leadless components.

In reflow soldering, individual solder pads are pre-tinned at the desired locations by use of molten solder which is then allowed to solidify. The desired electrical conductors, also pre-tinned, are then placed in mechanical contact with their proper pads and the entire board is raised to the desired temperature either by radiant heating or by various other methods. A particular problem with the reflow process is that all solder joints on a given board do not always require the same amount of solder or have different amounts of adjoining metal in contact with the solder. The result is that various solder joints will have different heat-input requirements so that standard radiant or convective heat-input methods will tend to overheat the smaller joints while underheating the larger joints. During reflow soldering it is important to know the exact moment when the solid solder turns to liquid or vice versa and it is advantageous to be able to make this determination without making physical contact with the solder joint and without having to know the radiant emissivity of the surface. Since the prior art reflow processes all involve the exposure of the entire circuit board assembly to elevated temperatures there is always the danger of damaging the electronic components during the reflow soldering process.

A new and improved reflow soldering technique has been disclosed in U.S. patent application Ser. No. 619,438, filed Jun. 11, 1984 which is assigned to the same assignee as the present application. Since various solder joints have different heat-input requirements and since there is a danger of damaging the electronic components during an overall heating operation. application Ser. No. 619,438 discloses a method for individually heating each solder joint by means of a focused laser beam while the surface of the material being heated to its melting point is monitored by an infrared detection system so as to interrupt the application of heat upon the completion of reflow. Thus each individual joint may be soldered under controlled heating conditions without fear of damage to the associated electronic component.

In order to detect and correct various defects which might occur during the assembly and soldering of the printed circuit board, various inspection techniques are well known in the art. A visual inspection will detect the more obvious defects but such visual inspection is tedious and costly. However the principal disadvantage with visual inspection resides in the fact that humans are subject to fatigue, errors in judgement and to variability in their "accept/reject" thresholds. An assembled printed circuit board can also be tested by means of contact devices which measure electrical parameters.

However, such electrical parameters usually result from the compound action of several components whose individual performance therefore cannot be checked. As a result about three percent of all printed circuits which pass conventional testing actually contain incipient defects which might cause early failure in the field.

In order to provide a more thorough inspection of assembled printed circuit boards an infrared non-contact system was devised for inspecting infrared emitting components in an electronic device. Such a system is discussed in U.S. Pat. No. 3,803,413, granted Apr. 9, 1974. While some devices radiate thermal energy as a result of electrical energization other devices require the injection of thermal energy into the component such as a solder joint to heat the component so that the infrared radiation given off can then be detected. U.S. Pat. No. 3,803,413 teaches the use of laser devices for injecting the thermal energy into the various components and a scanning system which enables the thermal energy to be injected in sequence into a specific array of components as would be found with the numerous solder joints on a printed circuit board. An improved laser-infrared inspection system is disclosed in U.S. Pat. No. 4,481,418. In this system, an infrared laser provides a thermal pulse and a visible wavelength of another laser is used for targeting. The laser beams are made coaxial within a flexible optical fiber which serves as a beam homogenizer and which provides mechanical isolation between the lasers and the rapid movements of the positioning table. The infrared laser beam is injected into each respective solder joint and the heating of each solder joint causes the emission of infrared thermal energy from the joint which will provide a thermal signature for each specific solder joint. This signature will consist of a rise during the heat injection and a decay during the cooldown phase after the end of the heating laser pulse.

A computer is utilized for controlling the inspection and for evaluating the thermal data. The X-Y target coordinates on the positioning table are stored in a computer prior to the inspection of each design of a printed circuit board. The computer positions each target in turn on the optical axis, controls the laser's shutter operation and samples and prints out the detector signal at its peak value and three times afterwards, typically, at 5 ms intervals. It also monitors the detector output for any unusual heating conditions which might result if, due to mistargeting, a component or substrate is in danger of being burned. Standard data is provided in the computer memory against which the test data is compared by the computer. The computer is provided with means for printing out the thermal data for an entire circuit board and for flagging or identifying defects. The flagging process in which the computer identifies the defects makes use of the standard deviation values which were computed. Alternatively high and low threshold values for each of the solder joints can be entered through the keyboard based on operator judgement and experience. The circuit board is then transferred to an automatic network station where each improper solder joint is automatically displayed to an operation who can quickly make the necessary corrections.

A problem is inherent in the resoldering of solder joints. During the soldering process intermetallic compounds are formed in every solder joint. The amount of such intermetallic compounds increases with every touchup of the solder joint causing the solder joint to become very brittle and susceptible to breakage. Therefore the correction procedures cause a condition which might lead to future failures in the solder joints, especially if the printed circuit board is subjected to various stresses during use. Therefore, it is very important to limit the amount of touchup to a bare minimum, necessary only for those solder joints that have been verified as being in real need of repair, and avoiding any routine touchup for cosmetic appearance only. The present invention allows this goal to be precisely met.

SUMMARY OF THE INVENTION

The present invention provides a new and improved method and apparatus for placing, soldering and inspecting components on a printed circuit board at a single work station thereby substantially reducing the equipment cost and the time factor over prior art systems requiring the sequential transfer of the circuit board between a plurality of different machines for carrying out a plurality of different functions.

The present invention provides a new and improved method for placing, soldering and inspecting components on a printed circuit board, comprising automatically transferring electronic components from supply means to a printed circuit board by transfer means, wherein the elements to be soldered together have contact points which are pre-tinned or otherwise supplied in advance with solder material, injecting thermal energy into said contact points by laser means while the respective electronic component is held in position on said circuit board by said transfer means to liquify the solder material at each contact point, detecting infrared radiation emitted by the heated solder material by infrared detector means to determine the instant all solid solder material has been melted at the contact point to provide a signal for turning off the laser means, continuing the sensing of infrared radiation by means of said infrared detector means during cool down of the solder joint and comparing the signal provided by the infrared radiation during cool down with a standard ideal signal stored in a memory to determine the acceptability of the soldering joint.

The present invention provides a new and improved apparatus for placing, soldering and inspecting components on a printed circuit board comprising supply means for sequentially supplying electronic components to a work station, support means at said work station for moveably supporting a printed circuit board, transfer means for automatically selecting, transferring and temporarily holding said electronic components in a predetermined sequence at predetermined locations on said printed circuit board, laser means for injecting thermal energy into previously applied solder material at each desired contact point in sequence to liquify the solder material, infrared sensing means for continuously sensing the infrared radiation emitted by each solder joint during heating of said solder joint and providing a signal indicative of the liquifaction of said solder material, control means for receiving said signal indicative of liquifaction of said solder material for turning off said laser means and inspection means for comparing the signal provided by said infrared detector means subsequent to the turning off of said laser means with a standard signal to determine acceptability of each solder joint.

The foregoing and other objects, features and advantages of the invention will be apparent from the following more particular description of a preferred embodi-

DETAILED DESCRIPTION OF THE INVENTION

Figure 1:
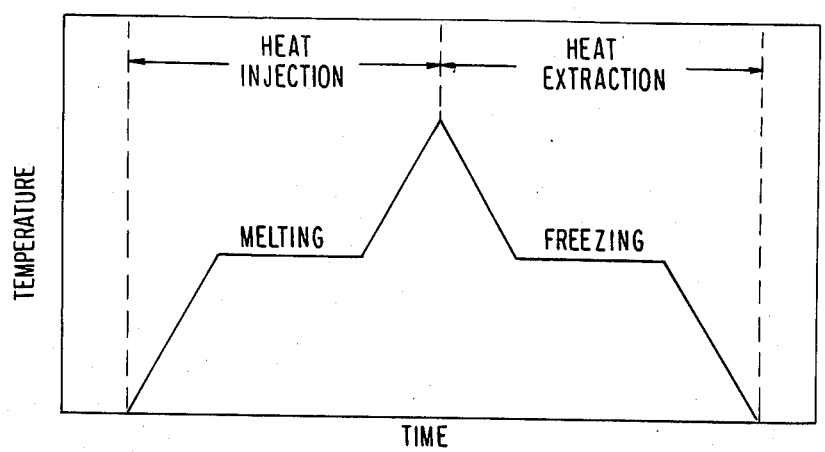
FIG. 1 is an explanatory graph of the temperature and time characteristics of a material undergoing phase changes with constant heat input and output rates assumed and temperature uniformity maintained throughout the material during heating and cooling.

The present invention is basically a combination of any well known pick and place system in combination with a reflow solder system utilizing laser means for the sequential and/or simultaneous thermal injection of solder joints for mechanically and electrically connecting electronic components to a printed circuit board while the components are still under the control of the transfer mechanism of the pick and place machine without the need to use any adhesive. The present invention further utilizes an infrared detection system for detecting the reflow of the solder from each solder joint as well as for the inspection of each solder joint for determining the acceptability thereof.

The pick and place machine utilized in the present invention may be any one of the well known pick and place systems such as the DYNAPERT-PRECIMA TM Microplacement System (MPS-500). Such a system utilizes a wide variety of component feed mechanisms which are capable of handling small ship resistors, capacitors and diodes, small outline transistors, small outline integrated circuits and leaded/leadless chip carriers, both ceramic and plastic. While such a machine is provided with two pick and place heads which move alternately from the feeder to the circuit board only a single representative pick and place head 10 has been illustrated in FIG. 3 of the present application for placing a representative electronic component 30 on a printed circuit board 26 which is mounted for indexing movement upon an X-Y table 28.

The only modification necessary to the microplacement system identified above is the elimination of the adhesive dispensing system since it is unnecessary, according to the present invention, to adhesively secure the components to the printed circuit board even on a temporary basis. According to the present invention the electronic component 30 is electrically and mechanically connected to the proper contact points on the printed circuit board 26 by means of a reflow solder technique while the electronic component is momentarily held in the desired position on the printed circuit board by means of the pick and place head 10.

The present invention makes use of a well known physical phenomenon dealing with solids which are being heated to their melting points. During heating, the temperature of the solids continues to rise until melting begins. At this point, the further addition of heat causes no further temperature increase until the material is fully melted, after which the liquid will be observed to increase in temperature. For a material in any given state, the rate of temperature increase is almost exactly proportional to the rate of heat input, whether the material is a solid, liquid or a gas. As a heated solid reaches its melting temperature, the further addition of heat energy serves to overcome the molecular binding forces which hold the material rigid. Heat therefore seems to disappear within the material for a short time without causing a further temperature increase. A well defined amount of thermal energy is required in order to melt each gram of a given material. This is called the latent heat of fusion and is added to the molecular energy of the material as it becomes liquid. This energy is then restored to the environment during the reverse of the process since a similar phenomenon occurs during cooling.

FIG. 1 illustrates an idealized surface-temperature history of a solid which is melted with a constant rate of heat input and is then frozen with a constant heat withdrawal rate. The sloping lines show a constant rate of surface temperature change while the level lines show heat entering or leaving the substance without causing a temperature change. The two upper sloping lines represent the heating and cooling of the material in the liquid state. These sloping lines may or may not have the same slope as the lower sloping lines depending upon whether the specific heat of the material changes during the transition. FIG. 1 assumes that the thermal changes which occur with time do so instantly throughout the material, that is, there are no thermal gradients and all parts are at the same temperature at any one time. Melting and freezing thus occur uniformly throughout the sample.

Figure 2:
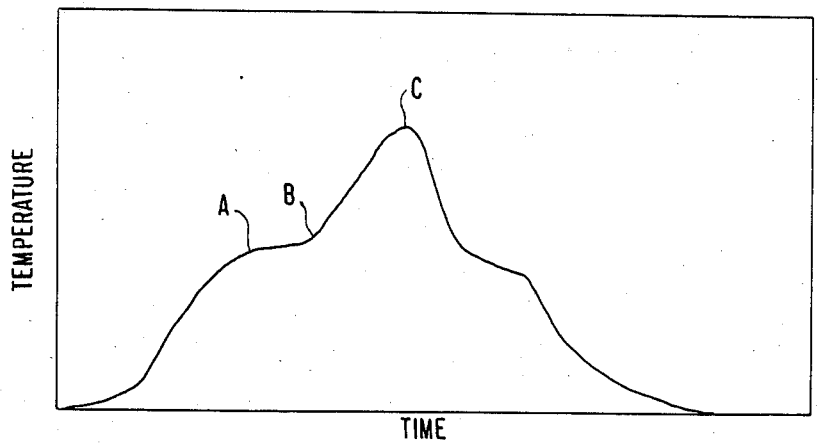
FIG. 2 is an explanatory diagram of the temperature and time characteristics of a material with normal (non-constant) heating and cooling rates assumed and with typical internal thermal gradients.

However in the practical case, materials to be melted are heated non-uniformly, usually from the surface inwardly, and time is required for the heat to penetrate the whole volume. Thermogradients exist and various parts of the material are at different temperatures at any one time. Thus, in actual practice the abrupt heating-rate discontinuities illustrated in FIG. 1 are softened by the fact that the change of state occurs at different times in various parts of the material. This can occur at the surface as well so that an infrared detector is viewing both phases at the same time. The result is seen in FIG. 2 which is typical of an actual laboratory result wherein a solid material is heated by the application of heat to one surface and then is allowed to cool normally while the surface temperature is observed.

Figure 3:
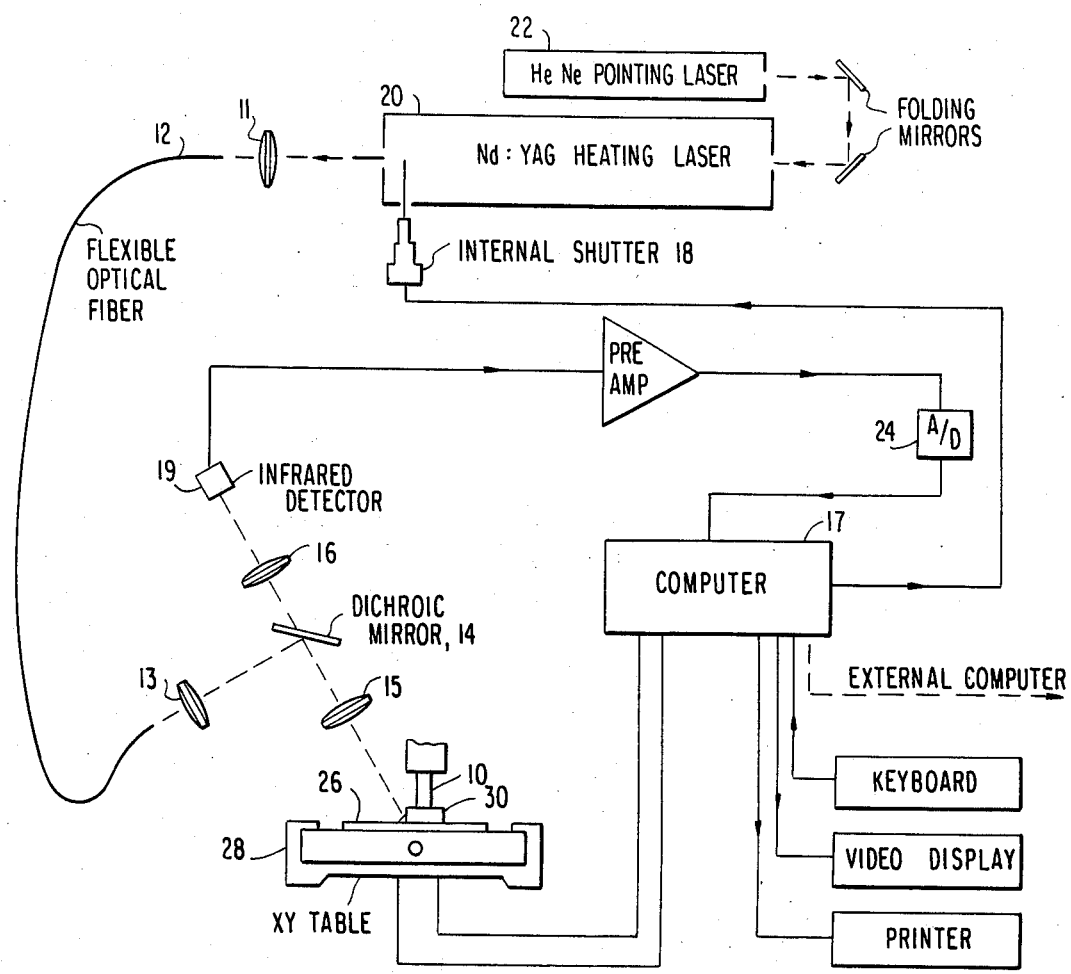
FIG. 3 is a diagramatic view of a reflow solder control system according to a first embodiment of the present invention.

In FIG. 3 the preferred heating source is a Nd:YAG laser 20 whose output beam is focused by a lens 11 into an optical fiber 12 where it emerges from the other end with a given divergence angle. It is then incident upon a lens 13 where it is rendered somewhat more parallel and proceeds to a dichroic mirror or beam splitter 14 which reflects the beam downwardly upon an infrared transmitting lens 15. The function of the lens 15 is to focus the laser beam upon the solder target upon the printed circuit board 26 which in turn is mounted on the X-Y table 28. The lens 15 also collects and directs upwardly some of the thermal radiation which leaves the target as it becomes heated. This radiation is at greater wave lengths than the YAG radiation, being typically in the range from about 2.5 to 5.5 $\mu$m (micrometers). The dichroic mirror 14 is specifically designed so as to be largely transparent to the longer wave length region so that most of the thermal radiation passes through it to a second infrared transmitting lens 16 which focuses the thermal radiation upon an infrared detector 19.

Dichroic beam splitters of the type used are available from optical interference filter suppliers who provide filter-design and fabrication services. Because the YAG laser beam is invisible, the red light beam from the helium neon (HeNe) laser 22 is added to the beam to render the focused spot visible. This is helpful during manual programming operations when the various solder-joint locations are being entered into the computer. This is done by means of table-control means which move the tables so that each solder joint in turn is located on the optical axis, whereupon its location is automatically entered into the computer when the operator presses another key.

The infrared detector signal is preamplified and is digitized by an analogue-to-digital (A/D) converter 24 whereupon it enters the computer 17. The detailed operation of the laser beam system for injecting thermal energy into each solder joint is disclosed in detail in copending application Ser. No. 619,438, filed Jun. 11, 1984.

While the schematic arrangement illustrated in FIG. 3 shows the detector, lenses and mirror mounted adjacent the moveable head, it is contemplated that the output end of the optical fiber 12 could be mounted on the moveable head 10 in close proximity to the workpiece thereby eliminating the need for the various lenses and mirror. Suitable optical fibers could also be provided to direct the infrared radiation from the heated element to the infrared detector mounted at a remote location.

Since it is important to discontinue the operation of the laser beam upon liquifaction of the solder material so as to eliminate the consequences of either over heating or underheating the solder joint, and to increase the speed of fabrication, the system according to the present invention also includes means for detecting the exact moment of liquification.

The means for detecting the exact moment of liquifaction rely upon the shape of the curve as illustrated in FIG. 2. The shape of the slope of the curve representing the temperature rise in FIG. 2 is characterized by a bulge or hump which indicates the beginning of liquifaction. During liquifaction the temperature of the solder remains constant and this is reflected in the plateau of the curve representing the output of the infrared detector focused on the spot being heated by the laser. At the end of liquifaction the temperature begins to rise sharply at point B. Thus the subsequent upwardly directed slope is indicative of the increase in the temperature of the liquid solder. At this point the detector output signal, which is duly processed through the electronic circuit of the computer immediately turns off the laser to avoid overheating. In this way a perfect solder joint is always formed. After the laser is turned off the temperature rise terminates at point C and begins to fall with the decreasing temperature being a substantially mirror image of the temperature rise curve. Different embodiments of circuitry for controlling the laser beam system for injecting thermal energy into each solder joint are disclosed in detail in copending application Ser. No. 619,438, filed Jun. 11, 1984.

Figure 4A:
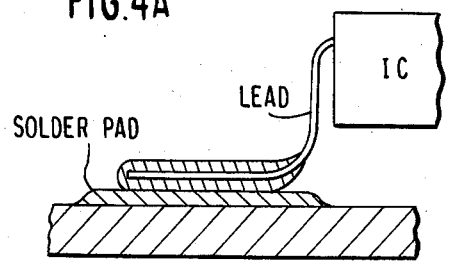
FIGS. 4A and 4B illustrate a lap solder joint before and after reflow respectively.
Figure 4B:
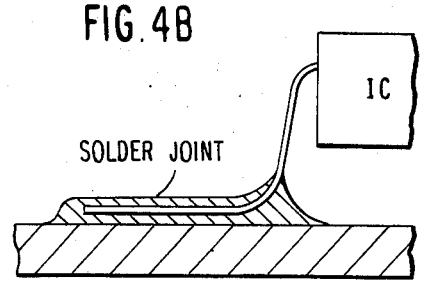
Figure 5A:
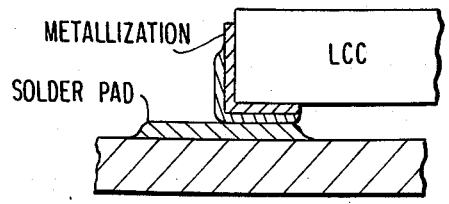
FIGS. 5A and 5B illustrate a solder joint for a leadless chip carrier before and after reflow respectively.
Figure 5B:
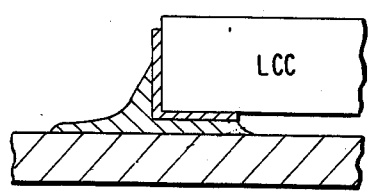

While a representative solder targets are illustrated in FIGS. 4A and 5A which will provide the soldered connections shown in FIGS. 4B and 5, respectively, upon being heated it is known that various electronic components have different types of leads or no leads so that the soldering requirements for each connection may vary widely from component to component on a given printed circuit board. The various techniques suitable for applying the above described laser-thermal injection to different types of solder connections are discussed in detail in copending application Ser. No. 619,438, filed Jun. 11, 1984. This copending application also discusses a means for controlling the laser beam in response to reflected radiation.

The present invention also includes an inspection system for immediately determining the acceptability of the just formed solder joint to determine the acceptability or nonacceptability of the solder joint. U.S. Pat. Nos. 3,803,413 and 4,481,413, both of which are assigned to the same assignee as the present application, disclose laser type inspection systems wherein thermal energy is injected into a solder joint to raise the temperature of the solder joint to a predetermined level and allowing the solder joint to cool. The infrared radiation emitted by the heated solder joint is detected by an infrared detector which will provide a signal or "signature" which is characteristic of each specific solder joint. Computer means are utilized for comparing the generated signal or "signature" with a standard signal or "signature" for that particular type of solder joint which will determine whether or not the solder joint being inspected is acceptable or not acceptable. Since the solder joint formed according to the present invention in the manner described above with respect to reflow solder technique is at an elevated temperature (FIG. 2) which was sufficient to liquify the solder material, the infrared detection means will continue to monitor the thermal radiation after the application of the laser beam has been discontinued while the heated solder joint is cooling down. The infrared detector means will provide a continuous signal or "signature" of each specific solder joint and the signature will be compared to a standard ideal curve or signature stored in memory. This cool down signature or trace contains information with respect to surface contamination, surface emissivity, thermal mass, and heat sinking. In other words all parameters defining the quality and the integrity of the solder joint may be inspected and compared with a standard in the same operation with the reflow soldering of the solder joint. On the basis of current experience and according to the type of solder joint, the whole sequence of insertion-application, reflow soldering and cool down might take anywhere from 50 to 1,000 milliseconds. For multi-leads or multi-end components, simultaneous reflow solder and infrared detector control can be achieved by splitting the laser beam into two or more terminals and by using two or more detectors.

The use of clean, pre-tinned elements will eliminate the need for fluxing compounds and this in turn will eliminate the need for washing, cleaning and drying that is unavoidable in the wet processes used in previous systems. For surface mounted components the need for an adhesive is completely eliminated and since the soldering takes place while the component is pressed in place, no displacement whatsoever can be expected. This greatly reduces the number of items to be visually inspected especially since almost all printed circuit handling has been eliminated. The few items left to visual inspection are component presence, orientation, coding, and damage. This task can be easily performed by an automated vision machine also incorporated into the overall system. The vision machine can look at every component part immediately or soon after soldering either through a direct line of sight or through a conherent optical fiber offering adequate spatial resolution. Whenever a defect is detected, either by the infrared control system or by the vision machine, an alarm can be activated calling for manual correction of the fault and its cause or an electrical signal can, through a feedback loop, implement a corrective action of the variable that caused the defect.

While the invention has been particularly shown and described with reference to preferred embodiments thereof it will be understood by those in the art that the foregoing and other changes in form and detail can be made therein without departing from the spirit and scope of the invention.

What is claimed is:

1. An apparatus for placing, soldering and inspecting components and soldered connections on a printed circuit board, comprising: support means for moveably supporting a printed circuit board; supply means for sequentially supplying electronic components, a single mechanical means for automatically selecting, transferring and temporarily holding each electronic component at a predetermined location on said printed circuit board, in a predetermined sequence, wherein said single mechanical means is comprised of a pick and place head which continuously engages each component through said sequence board; laser means for injecting thermal energy into solder material disposed at desired contact points between one of said electronic components and said circuit board to liquify the solder material to form a plurality of solder joints, while each component is held by said mechanical means; infrared radiation sensing means for continuously sensing infrared radiation emitted from each solder joint during heating of each solder joint for providing a signal indicative of liquifaction of said solder material; control means receiving said signal indicative of liquifaction of said solder material for terminating the injecting of thermal energy by said laser means upon liquification of said solder material; and inspection means for comparing the signal provided by said infrared sensing means with a standard signal to determine acceptability of each solder joint.

2. An apparatus as set forth in claim 1 wherein said sensing means includes a single infrared detector for sensing thermal radiation from each solder joint for determining when liquification take place and for sensing thermal radiation for said inspection means.

3. An apparatus as set forth in claim 2 further comprising an additional radiation detector for sensing radiation reflected from said solder to determine the liquifaction of the solder.

4. An apparatus as set forth in claim 1 wherein said support means for said printed circuit board is comprised of a support table moveable along X-Y axes and means for shifting said support table for sequentially performing a reflow soldering operation on successive electronic components.

5. An apparatus as set forth in claim 1 wherein said laser injection and infrared sensing means is disposed at an acute angle relative to a line perpendicular to said printed circuit board.

* * * * *